United States Patent
Jeong et al.

(10) Patent No.: US 10,170,696 B1
(45) Date of Patent: Jan. 1, 2019

(54) MNN AND HEUSLER LAYERS IN MAGNETIC TUNNEL JUNCTIONS

(71) Applicants: INTERNATIONAL BUSINESS MACHINES CORPORATION, Armonk, NY (US); SAMSUNG ELECTRONICS CO., LTD., Suwon-si, Gyeonggi-Do (KR)

(72) Inventors: Jaewoo Jeong, San Jose, CA (US); Stuart S. P. Parkin, San Jose, CA (US); Mahesh G. Samant, San Jose, CA (US)

(73) Assignees: International Business Machines Corporation, Armonk, NY (US); Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/795,096

(22) Filed: Oct. 26, 2017

(51) Int. Cl.
| | |
|---|---|
| *G11C 11/00* | (2006.01) |
| *H01L 43/10* | (2006.01) |
| *H01F 10/30* | (2006.01) |
| *H01F 1/147* | (2006.01) |
| *G11C 11/16* | (2006.01) |
| *H01L 43/08* | (2006.01) |
| *H01L 27/22* | (2006.01) |

(52) U.S. Cl.
CPC .......... *H01L 43/10* (2013.01); *G11C 11/1673* (2013.01); *G11C 11/1675* (2013.01); *H01F 1/147* (2013.01); *H01F 10/30* (2013.01); *H01L 27/222* (2013.01); *H01L 43/08* (2013.01)

(58) Field of Classification Search
CPC ......... H01L 43/10; H01L 43/08; H01F 10/30; H01F 1/147; G11C 11/1675

USPC ......................................... 365/158, 171, 173
See application file for complete search history.

(56) References Cited

U.S. PATENT DOCUMENTS

| | | | |
|---|---|---|---|
| 6,834,005 B1 | 12/2004 | Parkin | |
| 6,869,806 B2* | 3/2005 | Cui | ........................ C30B 23/02 438/3 |
| 7,252,852 B1* | 8/2007 | Parkin | .................... B82Y 25/00 257/E43.006 |
| 7,274,080 B1* | 9/2007 | Parkin | ............... H01L 29/66984 257/30 |
| 7,973,351 B2* | 7/2011 | Marukame | .......... H01F 10/1936 257/295 |
| 8,445,981 B2 | 5/2013 | Lim et al. | |

(Continued)

OTHER PUBLICATIONS

Andrada-Oana Mandru et al, "Interface formation for a ferromagnetic/antiferromagnetic bilayer system studied by scanning tunneling microscopy and first-principles theory", Physical Review B 91, 094433 (2015), pp. 1-5.*

(Continued)

*Primary Examiner* — Viet Q Nguyen
(74) *Attorney, Agent, or Firm* — Daniel E. Johnson

(57) ABSTRACT

Materials are disclosed that are used as seed layers in the formation of MRAM elements. In particular, a MnN layer oriented in the (001) direction is grown over a substrate. A magnetic layer overlying and in contact with the MnN layer forms part of a magnetic tunnel junction, in which the magnetic layer includes a Heusler compound that includes Mn. The magnetic tunnel junction includes the magnetic layer, a tunnel barrier overlying the magnetic layer, and a first (magnetic) electrode overlying the tunnel barrier. A second electrode is in contact with the MnN layer.

16 Claims, 11 Drawing Sheets

(56) References Cited

U.S. PATENT DOCUMENTS

| | | | |
|---|---|---|---|
| 8,680,632 B2* | 3/2014 | Daibou | H01L 43/10 |
| | | | 257/421 |
| 9,166,152 B2* | 10/2015 | Chan | H01L 43/08 |
| 9,276,198 B2 | 3/2016 | Lim et al. | |
| 9,515,124 B2* | 12/2016 | Nakamura | H01L 27/228 |
| 9,666,215 B2* | 5/2017 | Faleev | G11B 5/3909 |
| 9,935,260 B2* | 4/2018 | Saida | H01L 43/08 |
| 9,966,529 B1* | 5/2018 | Iwata | H01L 43/10 |
| 2003/0029520 A1* | 2/2003 | Ingvarsson | B82Y 25/00 |
| | | | 148/108 |
| 2007/0297103 A1* | 12/2007 | Zhang | B82Y 10/00 |
| | | | 360/324.12 |
| 2007/0297220 A1* | 12/2007 | Yoshikawa | B82Y 25/00 |
| | | | 365/158 |
| 2009/0244957 A1* | 10/2009 | Clinton | G11C 5/02 |
| | | | 365/158 |
| 2010/0316890 A1 | 12/2010 | Choi et al. | |
| 2013/0292806 A1* | 11/2013 | Ma | H01L 29/06 |
| | | | 257/632 |
| 2014/0077319 A1 | 3/2014 | Noma et al. | |
| 2015/0162378 A1* | 6/2015 | Carey | H01L 43/02 |
| | | | 257/421 |
| 2016/0043300 A1 | 2/2016 | Kim et al. | |
| 2016/0043301 A1* | 2/2016 | Butler | H01L 43/08 |
| | | | 257/427 |
| 2016/0217842 A1* | 7/2016 | Jeong | G11C 11/161 |
| 2016/0380185 A1* | 12/2016 | Kato | H01F 10/3295 |
| | | | 257/421 |
| 2017/0117458 A1* | 4/2017 | Sonobe | G11C 11/161 |
| 2017/0125045 A1* | 5/2017 | Faleev | G11B 5/3909 |
| 2017/0279034 A1* | 9/2017 | Matsuzawa | G01L 1/16 |
| 2017/0330668 A1* | 11/2017 | Takahashi | H01F 10/06 |
| 2018/0083066 A1* | 3/2018 | Fukuzawa | H01L 43/08 |
| 2018/0205008 A1* | 7/2018 | Jeong | H01L 43/10 |

OTHER PUBLICATIONS

Walter R. L. Lambrecht et al, "Electronic structure and magnetic interactions in MnN and Mn3N2", Physical Review B 68, 174411 (2003), pp. 1-11.*

Teodor Huminiuc, "Novel Antiferromagnets for Spintronic Devices", Physics Phd Paper, University of York, Apr. 2007.*

M. Marques et al, "Theoretical prediction of ferromagnetic MnN layers embedded in wurtzite GaN", Applied Physics Letters 88, 0022507 (2006), http://dx.doi.org/10.1063/1.2162802.*

* cited by examiner

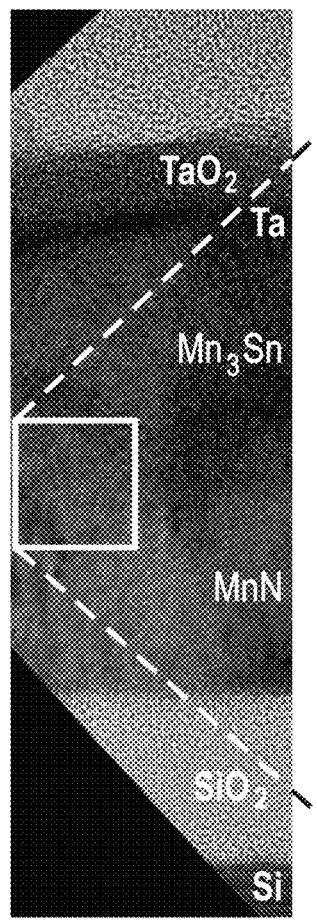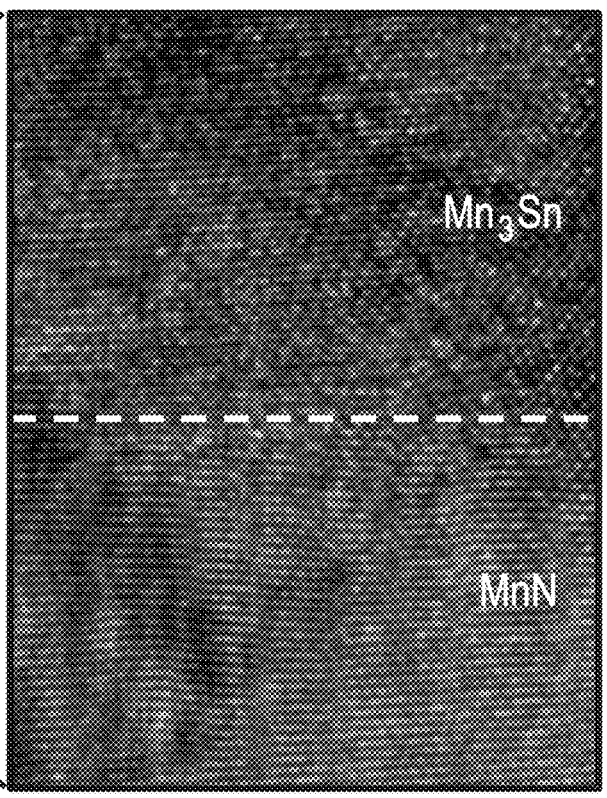
FIG. 6A                    FIG. 6B

MNN AND HEUSLER LAYERS IN MAGNETIC TUNNEL JUNCTIONS

PARTIES TO A JOINT DEVELOPMENT AGREEMENT

This invention was made under a joint development agreement between International Business Machines Corporation and Samsung Electronics Co., Ltd.

TECHNICAL FIELD

The invention relates to magnetic tunnel junction magnetoresistive devices, and more particularly, to a magnetic random access memory that employs such devices.

BACKGROUND

A magnetic random access memory (MRAM) device uses magnetic tunnel junctions (MTJs) as the memory elements, where the MTJ is composed of at least two magnetic electrodes separated by a tunnel barrier. One of the electrodes has a magnetic moment whose direction is fixed, and the other electrode (known as the free or memory layer) has a moment whose direction is either parallel or anti-parallel to that of the fixed moment, so that the MTJ has two different states. These two states of the MTJ have significantly different resistance values for spin polarized tunneling current. When the MTJ element is placed between two wires or electrodes, a current can be passed between the electrodes to read the resistance state and/or to write (change) the state of the MTJ using spin transfer torques. The area of the MTJ may be tailored to match the respective technology node of the existing CMOS technology. As this area is shrunk, the energy barrier to rotation of the free layer with respect to the fixed layer from thermal fluctuations is diminished. This may be problematic if the electrodes are made of a material with an insufficiently high energy barrier.

SUMMARY

New materials having a high energy barrier are disclosed for use in MRAM devices. High anisotropy energies can be realized from materials having innate magnetic crystal anisotropy, such as the Heusler compounds disclosed herein, since their energy barrier is directly related to the magnetic anisotropy of the free layer.

Heusler compounds have the chemical formula $X_2YZ$ or $X'X"YZ$, wherein X, X', X" and Y are transition metals or lanthanides (rare-earth metals), and Z is a main group metal. The Heusler compounds disclosed herein are ferromagnetic or ferrimagnetic, depending on the exchange interaction between the magnetic moments at the X, X', X" and/or Y sites. Moreover, while most Heusler compounds are cubic and exhibit weak or no significant magnetic anisotropy, some Heuslers are tetragonally distorted: Due to this distortion, the magnetization exhibited by these compounds may be aligned along the tetragonal axis. Thus, thin films formed from such materials may exhibit perpendicular magnetic anisotropy (PMA) due to a magnetocrystalline anisotropy associated with the tetragonally distorted structure. Some examples of such tetragonal Heusler compounds suitable for use herein are binary compounds (e.g., $Mn_3Z$, where Z=Ge, Ga, Sn, or Sb) and ternary compounds (e.g., $Mn_2CuSb$, $Mn_2CoSn$, $Mn_2OsSn$, etc.).

FIG. 1 shows a desired material stack with the Heusler alloy employed as the hard magnet with giant perpendicular magnetic anisotropy. This material stack can be used in several applications: as a storage layer in a magnetic disk drive, as the fixed layer in a magnetic tunnel junction, and as a replacement for a hard magnet (thereby avoiding the use of rare earth elements). For MRAM applications the thickness of the Heusler alloy should be very thin so that (i) it can be switched by spin transfer torque and (ii) demagnetizing fields are minimized. Thus, the Heusler compound is grown on underlayers to provide for electrical connections: These underlayers also are used to promote the growth of the Heusler layer in an appropriate crystal orientation that sustains high perpendicular magnetic anisotropy (PMA), in which the magnetization of the Heusler layer is perpendicular to the plane of that layer. Heusler compounds having significant PMA typically show a tetragonal distortion from their cubic structure; thus, the Heusler layer is grown so that the tetragonal axis is perpendicular to the layer. The Heusler compounds disclosed herein are preferably formed from binary or ternary alloys that contain manganese.

Disclosed herein is a seed layer that facilitates the growth of oriented Heusler compounds, thereby providing the crystal orientation required with respect to the tetragonal axis (i.e., c axis) perpendicular to the growth plane. This seed layer contains light elements, with MnN being the preferred candidate, since nitrogen is also a light element. Furthermore, MnN has a simple cubic structure with a lattice constant of 4.01 Angstroms that closely matches those of Mn-based tetragonal Heusler compounds.

One embodiment of the invention is a stacked structure that includes a substrate and a MnN layer overlying the substrate, in which the MnN layer is predominantly oriented in the (001) direction. A magnetic layer overlies and is in contact with the MnN layer. The magnetic layer (which is ferromagnetic or ferromagnetic) forms part of a magnetic tunnel junction; furthermore, the magnetic layer includes a Heusler compound that includes Mn.

In a preferred embodiment, the magnetic tunnel junction includes the magnetic layer, a tunnel barrier (e.g., MgO, AlN, or $Mg_{1-x}Al_{2-x}O_4$, wherein −0.5<x<0.5) overlying the magnetic layer, and a first (magnetic) electrode overlying the tunnel barrier. A second electrode is in contact with the MnN layer, thereby permitting current to be passed through the stacked structure. The MnN layer, the magnetic layer, and the tunnel junction may advantageously have respective crystalline structures that are coincident with each other. At least 100 of such structures may be interconnected to form a memory device, into which data may be read into or out of.

Another embodiment of the invention is a stacked structure that includes a substrate and a MnN layer overlying the substrate. The MnN layer is predominantly oriented in the (001) direction, and a magnetic layer overlies and is in contact with the MnN layer. The magnetic layer includes a Heusler compound that includes Mn, and the magnetic layer is ferromagnetic or ferrimagnetic. The magnetic layer may advantageously include discrete magnetic domains. When data are stored in these domains, they have respective magnetization directions that correspond to these data.

BRIEF DESCRIPTION OF THE DRAWINGS

FIG. 6 includes FIGS. 6A and 6B. FIG. 6A shows a cross-sectional high-resolution transmission electron microscopy (HR-TEM) image corresponding to the MnN/$Mn_3Sn$ sample of FIG. 5. The image in FIG. 6B is a magnified view of the boxed area in FIG. 6A. The dashed line in FIG. 6B approximately marks the interface between the two layers.

FIG. 8 includes FIGS. 8A and 8B.

DETAILED DESCRIPTION

Figure 1:
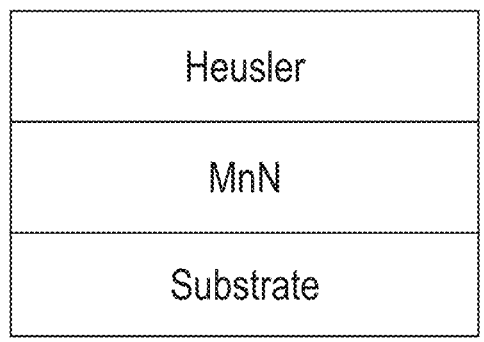
FIG. 1 is a schematic of a Heusler-based hard magnet with giant perpendicular magnetic anisotropy (PMA).
Figure 2:
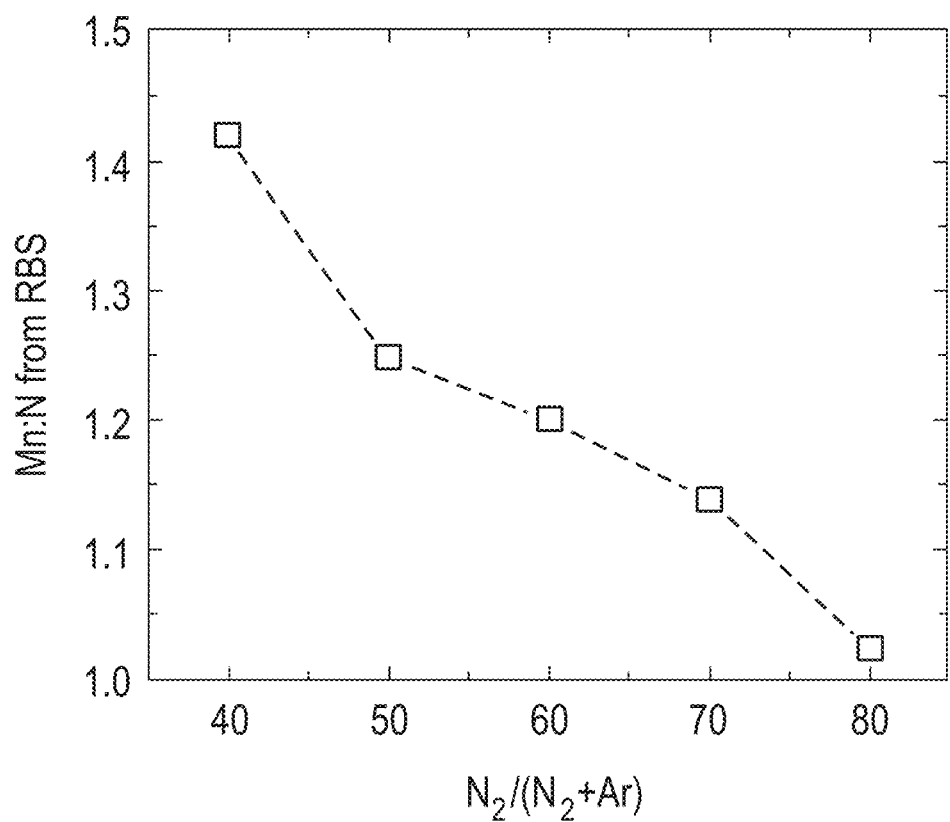
FIG. 2 shows the Mn:N ratio, as determined by Rutherford backscattering (RBS), for MnN films grown with different ratios of $Ar:N_2$ in the sputter gas.

MnN films were deposited on Si substrates having a 25 nm thick, thermally oxidized $SiO_2$ layer in an ultra-high vacuum chamber with a base pressure of ~$1\times10^{-9}$ Torr. The Si substrates were sequentially cleaned in a UV ozone chamber to remove any adsorbed organic material, rinsed in a de-ionized water bath to remove water soluble contaminants and particulates, exposed to hot isopropanol (IPA) vapors to remove water, and finally dried in a hot nitrogen furnace at ~60° C. The MnN seed layer was deposited by reactive dc magnetron sputtering in a gas mixture of Ar and nitrogen, from a Mn metal target at a gas pressure of $3\times10^{-3}$ Torr. The relative ratio of Mn:N within the MnN layers was controlled by tuning the Ar:$N_2$ ratio, as indicated in FIG. 2. The composition of the MnN films was determined by Rutherford backscattering (RBS) from a series of 200 Å MnN films that had been deposited on graphite substrates and capped with 100 Å Pt to prevent their oxidation upon exposure to the ambient environment. The graphite substrates (which contain predominantly carbon, an element having an atomic number lower than that of nitrogen) allow determination of the nitrogen content of the MnN films to within +/−0.5%. The stoichiometric films of MnN are obtained at an Ar:$N_2$ ratio of 20:80. Alternately, it was possible to grow MnN by sputtering from a MnN target.

Figure 3:
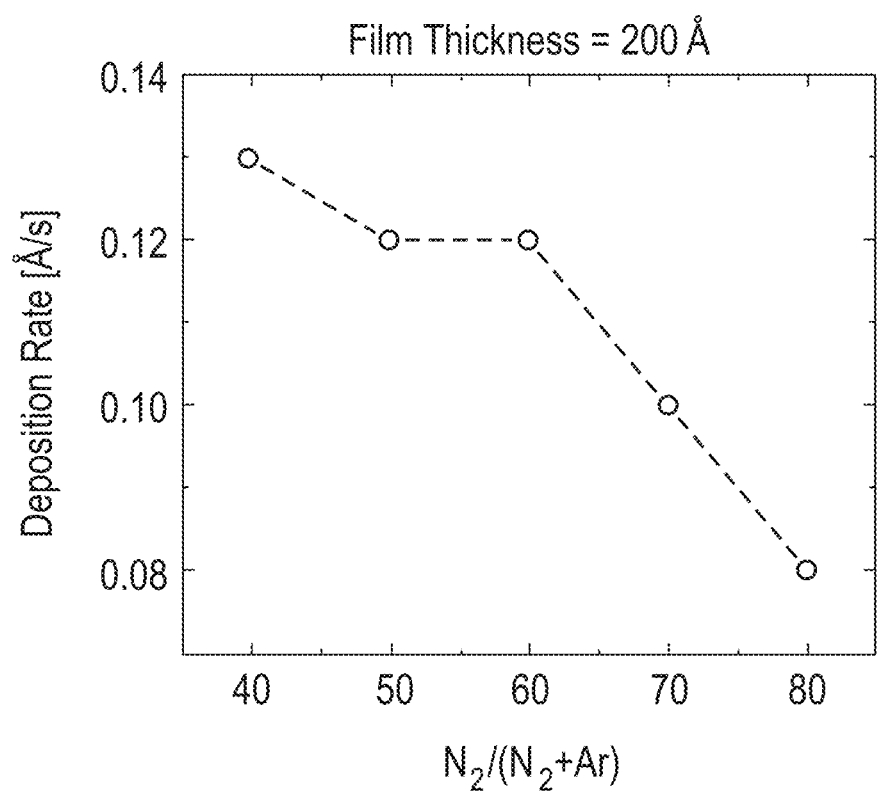
FIG. 3 shows the dependence of the MnN deposition rate on the $N_2$ content of the sputter gas, for 200 Å thick MnN films.

The conductivity of these MnN films was determined close to the center of the sample by a 4-point-in-line probe technique. The spacing between the 4 contacts was ~1 mm, which was much smaller than the sample size (1" diameter). The conductivity of the MnN films increases with the $N_2$ content in the films. The conductivity of the stoichiometric MnN films (approximately 2.65 MS/m) is comparable to metallic underlayers typically used in magnetic tunnel junction stacks (e.g., the conductivity of Ti is 2.38 MS/m; that of Ta is 1.05 MS/m). Moreover the conductivity of the MnN films is almost an order of magnitude higher than the TaN seed layer also used in MTJ stacks (e.g., the conductivity of a TaN film grown with 10% $N_2$ in Argon by reactive rf magnetron sputtering is reported to be 0.14 MS/m). This significantly higher conductivity of the MnN compared to that of TaN facilitates use of thicker MnN films of several tens of nm within the MTJ stack. The deposition rate of the MnN films depends on the $N_2$ content in the sputter gas mixture, decreasing significantly and almost linearly with increased $N_2$ content (see FIG. 3). This almost linear decrease in deposition rate of a nitride film has also been observed for growth of TaN films by reactive rf magnetron sputtering from a Ta metal target in a $N_2$:Ar gas mixture (see Nie et al., Applied Physics A, 73, 229 (2001)).

Figure 4:
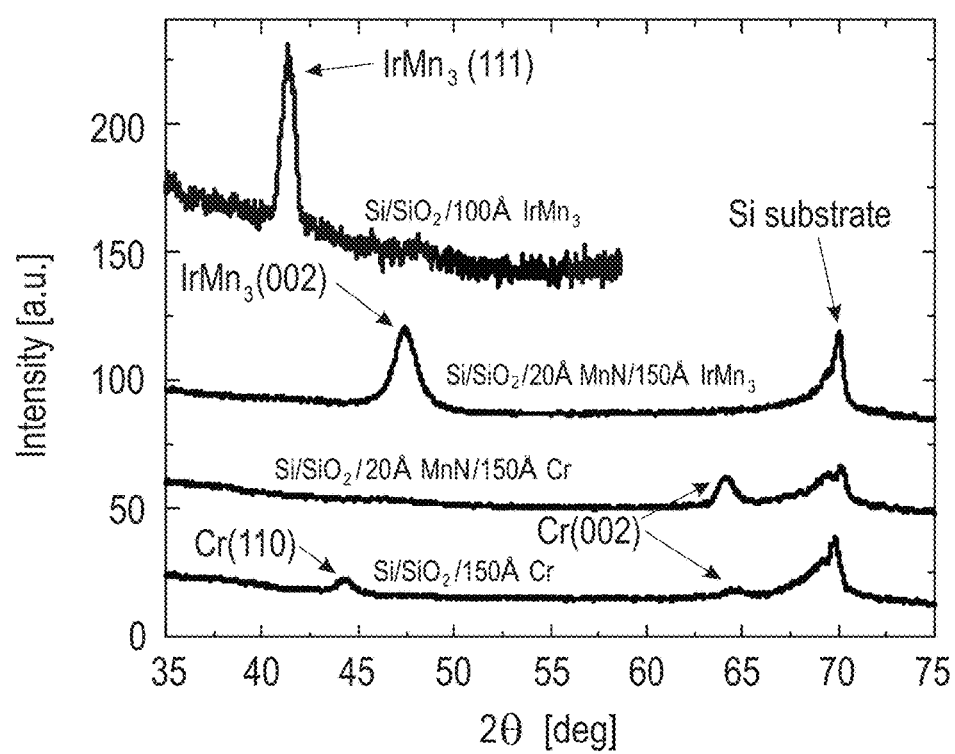
FIG. 4. Out-of-plane x-ray diffraction theta-2theta scans of 150 Å films of Cr (second from bottom) and $IrMn_3$ (second from top) grown on a 20 Å MnN seed layer on a Si(100)/250 Å $SiO_2$ substrate. X-ray diffraction (XRD) scans from 150 Å films of Cr (bottom trace) and 100 Å $IrMn_3$ (top trace) grown directly on a Si(100)/250 Å substrate without a MnN seed layer are included for comparison.

FIG. 4 demonstrates that use of a MnN seed layer promotes the preferred (001) texture of a thin film deposited over it. The X-ray diffraction (XRD) data on $IrMn_3$ and Cr films are included in this figure, as both of these have been used as seed layers for the (001) oriented growth of tetragonal Heusler alloy films. These samples were capped with a 30 Å Ta layer to prevent their oxidation when exposed to the ambient environment. The XRD measurements were carried out on a Bruker X-ray diffractometer with a General Area Detector Diffraction System (GADDS) area detector. The $IrMn_3$ and Cr films were deposited at room temperature with and without a MnN seed layer on Si(100) substrates that had a thermally grown 250 Å thick layer of amorphous $SiO_2$ (Si(100)/250 Å $SiO_2$). These samples were capped with 30 Å of Ta to protect the $IrMn_3$ and Cr layers from oxidation by exposure to the ambient environment. Only the samples having a Cr layer were annealed (in situ in the deposition chamber at 400° C. for 30 minutes). The fcc $IrMn_3$ film grows with a (111) texture on a Si(100)/250 Å $SiO_2$ substrate, whereas the bcc Cr film has a mixed texture with both (110) and (001) orientations along the sample's normal. We demonstrate here that MnN films even as thin as 20 Å (a film thickness in the range of 10 Å and 300 Å or 500 Å is preferred) promote the growth of highly textured films with (001) orientation of both bcc and fcc metals or alloys (as seen in FIG. 4 by the presence of (002) peaks and the absence of (111) and (110) peaks, when a 20 Å MnN layer is used).

Figure 5:
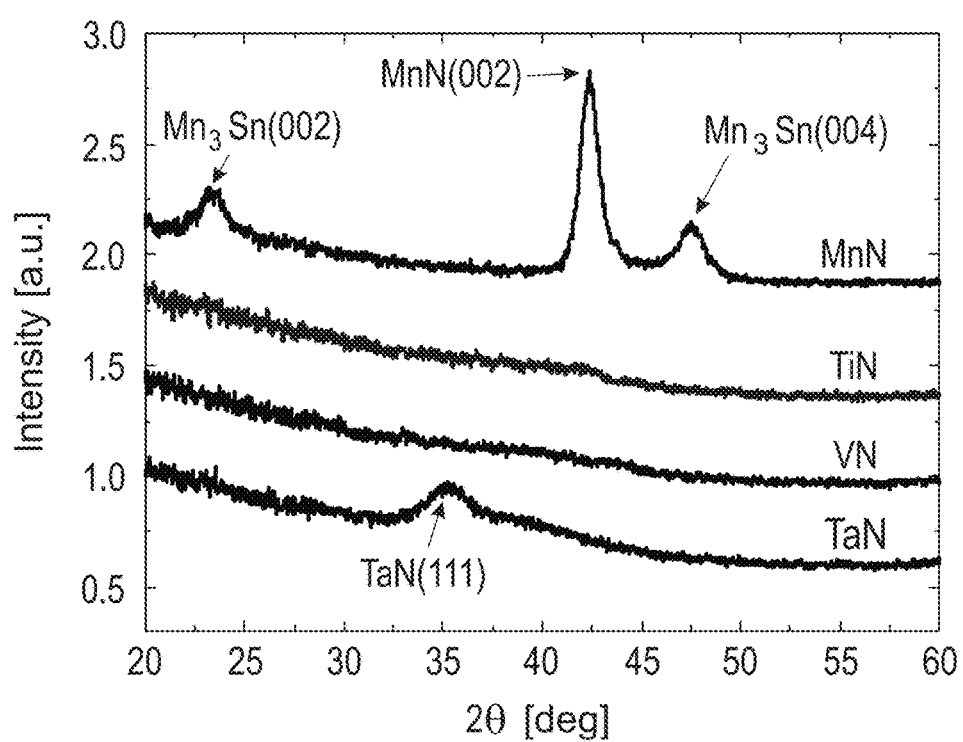
FIG. 5. X-ray diffraction theta-2 theta scans of 200 Å-thick $Mn_3Sn$ Heusler compounds grown on different 100 Å-thick nitride seed layers. The nitride seed layers were deposited at room temperature directly on amorphous $SiO_2$, while the $Mn_3Sn$ films were deposited at a substrate temperature of 200° C.

Table 1 is a compendium of some of the transition metal nitrides that are either metallic or semiconducting. Furthermore, the lattice constant of these nitrides is relatively close to the lattice constant of cubic MgO (4.21 Å), raising the possibility that these nitrides would promote growth of a (001)-oriented MgO tunnel barrier, which is the preferred tunnel barrier for MRAM. FIG. 5 demonstrates the uniqueness of MnN as a seed layer in promoting growth of a (001) oriented $Mn_3Sn$ Heusler film. Alternately, $Mn_3Sn$ can be replaced by other $Mn_3Z$ Heusler alloys, where Z=Ge, Ga, or Sb. The XRD data along the out-of-plane direction from a series of samples with Si(100)/250 Å $SiO_2$/100 Å×N (where X=Mn, Ti, V or Ta)/200 Å $Mn_3Sn$/30 Å Ta structure are compared in FIG. 5. The nitride layer and the Ta cap layer were deposited at room temperature, and the $Mn_3Sn$ layer was deposited at 200° C. These data reveal that the MnN film is highly textured and has a (001) orientation. This in turn promotes growth of a Mn$_3$Sn Heusler film with a (001) orientation, corresponding to the tetragonal axis (i.e., c axis) of the film. The magnetization of the Mn$_3$Sn Heusler film is aligned along its tetragonal axis, and thus the Mn$_3$Sn Heusler film with (001) orientation displays the desirable perpendicular magnetic anisotropy (PMA). Since none of TiN, VN, and TaN grows on the Si(100)/250 Å SiO$_2$ substrate with a (001) texture, these nitrides are unable to promote growth of the Mn$_3$Sn Heusler film with the preferred (001) texture.

FIG. 6 includes a representative cross-sectional high resolution transmission electron microscopy (HR-TEM) image from a Si(100)/250 Å SiO$_2$/100 Å MnN/200 Å Mn$_3$Sn/30 Å Ta sample. (The top-most portion of Ta is oxidized to form TaO$_2$.) The nitride and the Ta cap layers were deposited at room temperature, and the Mn$_3$Sn layer was deposited at 200° C. The various layers within the image are labeled; the XRD data (FIG. 5) indicate that the MnN film was highly textured. The magnified view of the interface between the MnN and the Mn$_3$Sn Heusler layers shows that the overlying Mn$_3$Sn layer grows epitaxially on the MnN layer.

Figure 7:
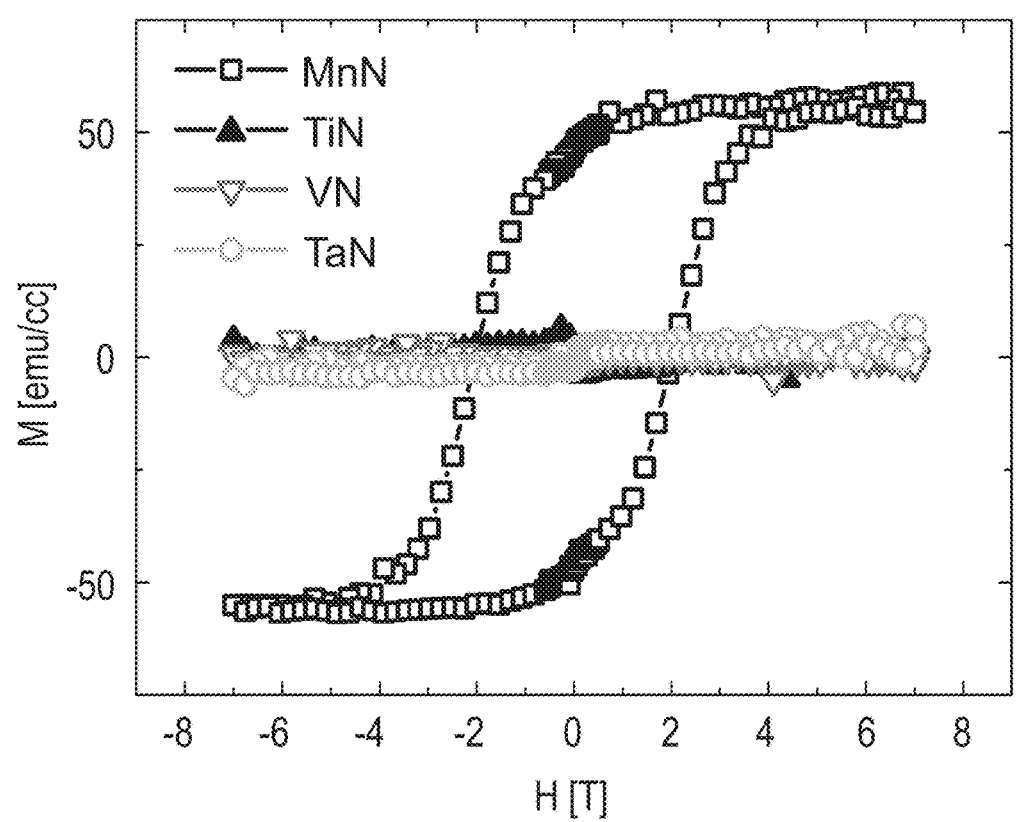
FIG. 7. Magnetization versus perpendicular magnetic field hysteresis loops of the $Mn_3Sn$ Heusler compounds of FIG. 5, measured at room temperature.

FIG. 7 summarizes the magnetization data for the same Mn$_3$Sn Heusler films used in collecting the XRD data described in FIG. 5. The magnetization hysteresis loops were measured in the out-of-plane geometry in a Quantum Design SQUID-VSM (superconducting quantum interference device-vibrating sample magnetometer) at room temperature. These data are consistent with our structural measurements, which indicated that the Mn$_3$Sn Heusler film had its tetragonal axis along sample normal only when deposited on the MnN seed layer. The Mn$_3$Sn Heusler films on other nitrides (such as TiN, VN, and TaN) show no perpendicular magnetic anisotropy. This Mn$_3$Sn Heusler film on a MnN seed layer has a large PMA at ambient temperature with a high coercive field of ~2 T.

Figure 8A:
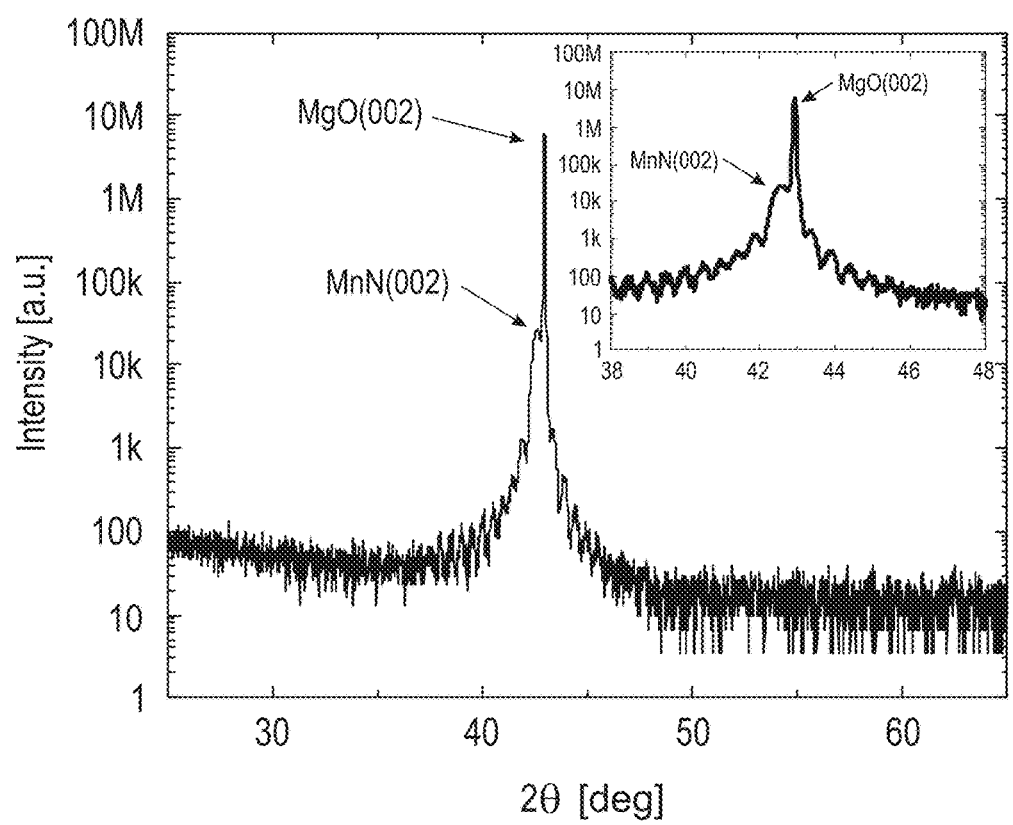
FIG. 8A shows an out-of-plane x-ray diffraction theta-2theta scan.
Figure 8B:
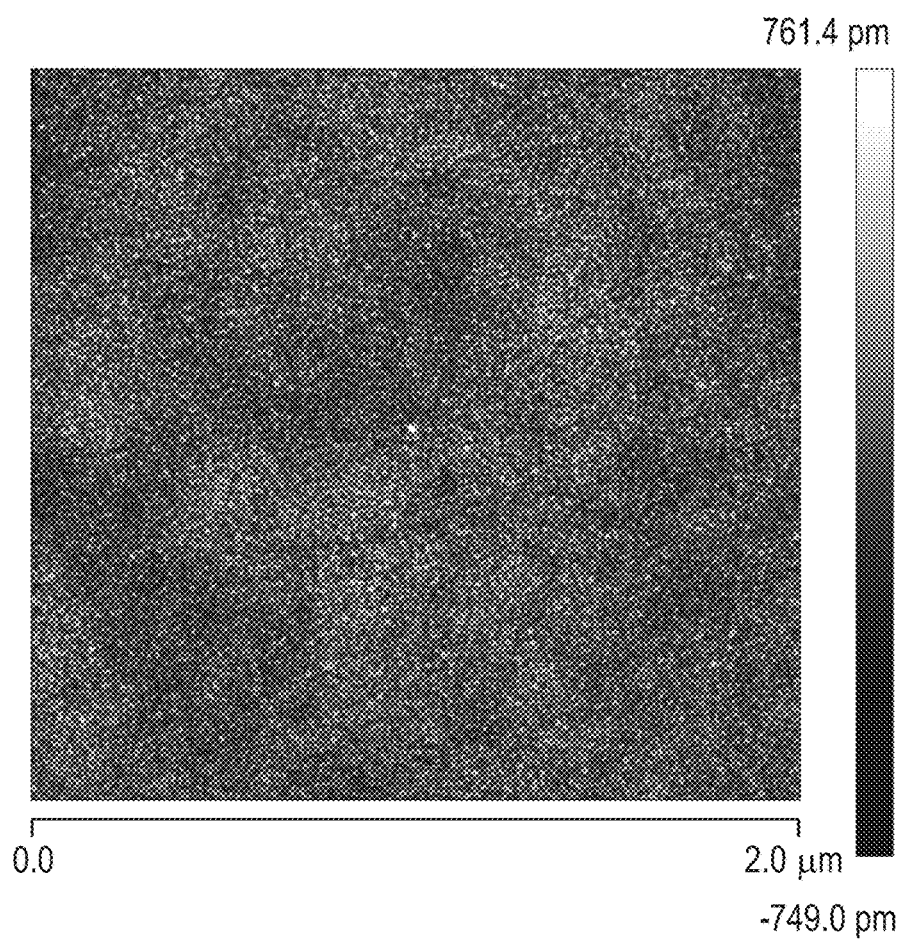
FIG. 8B shows an atomic force microscopy scan of a 200 Å MnN film deposited at room temperature on a MgO (001) substrate. The inset in FIG. 8A is a magnified view of the scan around the MnN (002) and MgO (002) diffraction peaks. The root mean square roughness, $r_{rms}$, measured from FIG. 8B is ~2.2 Å.

FIG. 8 demonstrates the utility of MnN as a metallic seed layer on single crystalline MgO(001) substrates. This is of particular relevance to the growth of Mn$_3$Z (where Z=Ge, Ga, Sn, or Sb) Heusler films on MgO substrates. The MnN seed layer is preferred over a conventional Cr seed layer, since during any subsequent anneal of the Heusler films the inter diffusion between the seed layer and the Mn$_3$Z Heusler film will not degrade the magnetic properties of the Heusler film. FIG. 8A shows an out-of-plane XRD scan of a 200 Å MnN on a MgO (001) substrate. The MnN film was deposited at room temperature and capped with a 30 Å layer of Ta to prevent oxidation of the MnN by atmospheric oxygen. The MnN film grows epitaxially on the MgO substrate, and the presence of Kiessig fringes indicates a high film quality. The periodicity of the fringes is consistent with the thickness of the MnN film. The root mean square roughness ($r_{rms}$) of 2.2 Å indicates that the film is ultra-smooth (see FIG. 8B).

Figure 9:
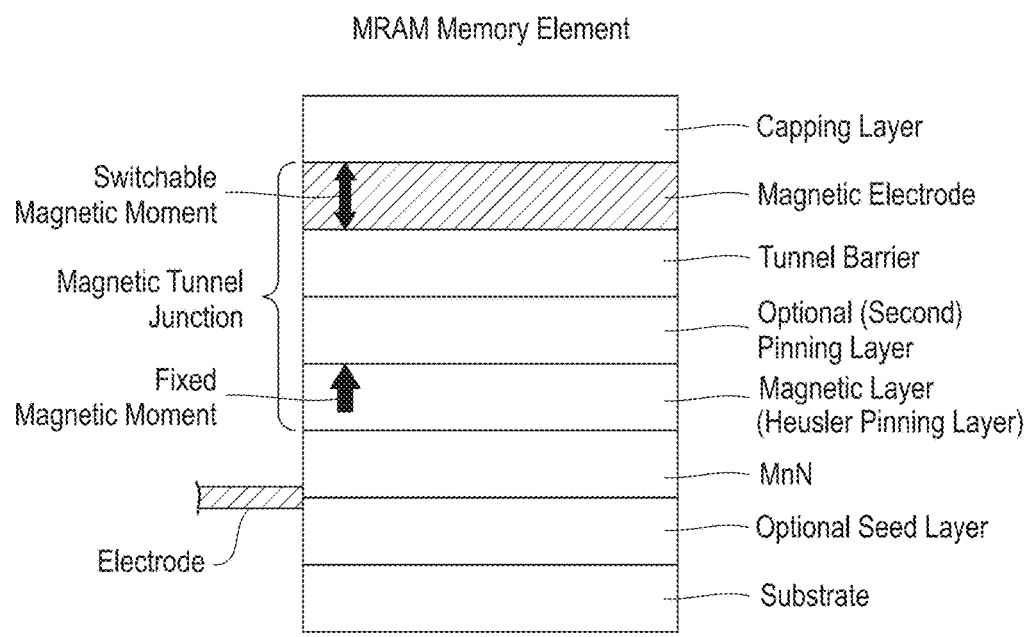
FIG. 9 illustrates a magnetic tunnel junction device that incorporates the MnN seed layer and Heusler layer described herein.

The structures described herein lend themselves to a variety of applications, including MRAM elements and a racetrack memory device, such as that described in U.S. Pat. No. 6,834,005, issued Dec. 21, 2004 and titled "Shiftable magnetic shift register and method of using the same," which is hereby incorporated herein. One such MRAM element is shown in FIG. 9, an array of which can be integrated together to form an MRAM device. As with MRAM elements generally, a tunnel barrier is situated between two magnetic electrodes, one of which has a fixed magnetic moment and the other of which has a magnetic moment that is switchable, thereby permitting the recording and erasing of data. Unlike MRAM elements of the prior art, however, the magnetic layer of FIG. 9 having the fixed magnetic moment (pinning layer) comprises Heusler films such as those described herein. Alternatively, these Heusler films can be a ternary compound, such as Mn$_2$CuSb, Mn$_2$CoSn, Mn$_2$OsSn, Co$_2$FeGe, etc., or even a quaternary compound, such as Co$_2$FeGa$_{0.5}$Ge$_{0.5}$. An optional (second) pinning layer may be advantageously employed for even better performance and may include Fe, a CoFe alloy or a Heusler compound, such as Co$_2$MnSi or Co$_2$FeAl.

Note that in FIG. 9, the pinning layer (Heusler layer, which may be either ferro- or ferri-magnetic) overlies a MnN seed layer which in turn overlies a substrate. As described herein, the MnN seed layer and the substrate may be advantageously chosen to promote growth of the Heusler layer, whose magnetic moment is aligned perpendicular to the layer plane. The tunnel barrier is preferably MgO (001), although other (001)-oriented tunnel barriers may be used, such as CaO and LiF. Alternatively, MgAl$_2$O$_4$ can be used as a tunnel barrier whose lattice spacing can be tuned by controlling the Mg—Al composition, thereby resulting in better lattice matching with the Heusler compounds. The magnetic electrode overlying the tunnel barrier may comprise Fe, a CoFe alloy, or a CoFeB alloy, for example. The capping layer may comprise Mo, W, Ta, Ru, or a combination thereof. Current may be induced by applying a voltage between the two magnetic electrodes, which are separated by the tunnel barrier.

Figure 10:
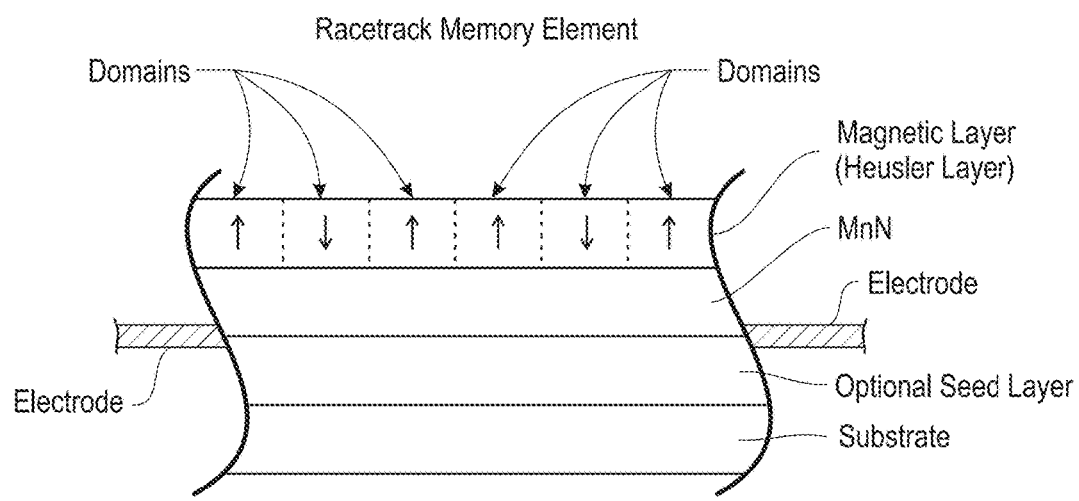
FIG. 10 shows a racetrack device that incorporates some of the layers shown in FIG. 9.

Certain structures described herein may also be used in racetrack memory devices. In this case, the racetrack is a nanowire that may include a substrate, an optional seed layer, a MnN layer, and a first magnetic layer of a Heusler compound. (See the discussion above with respect to FIG. 9 for possible compositions of these layers. Note that in a racetrack memory device (see FIG. 10), the tunnel barrier and the switchable magnetic layer shown in FIG. 9 would not normally be present; however, in this case the first magnetic layer shown in FIG. 9 would have a magnetic moment that is switchable rather than fixed.) Magnetic domain walls may be moved along this racetrack, as described in U.S. Pat. No. 6,834,005. Data may be read out of (and stored in) the racetrack by interrogating (or changing) the orientation of the magnetic moment of the magnetic material between adjacent domain walls within the racetrack.

The various layers described herein may be deposited through any one or more of a number of methods, including magnetron sputtering, electrodeposition, ion beam sputtering, atomic layer deposition, chemical vapor deposition, and thermal evaporation.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

TABLE 1

Lattice constant for several metallic/semiconducting nitride layers.

| Nitride | Lattice Constant | Comment |
| --- | --- | --- |
| MnN | 4.01 Å | Metal |
| CrN | 4.14 Å | Semiconductor (70 meV) |

TABLE 1-continued

Lattice constant for several metallic/semiconducting nitride layers.

| Nitride | Lattice Constant | Comment |
| --- | --- | --- |
| NbN | 4.38 Å | Metal |
| TaN | 4.33 Å | Metal |
| TiN | 4.23 Å | Metal |
| VN | 4.13 Å | Metal |
| MoN | 4.19 Å | Metal |

The invention claimed is:

1. A stacked structure, comprising:
a substrate;
a MnN layer overlying the substrate, wherein the MnN layer is predominantly oriented in the (001) direction; and
a magnetic layer overlying and in contact with the MnN layer, the magnetic layer forming part of a magnetic tunnel junction, wherein the magnetic layer includes a Heusler compound that includes Mn, and wherein the magnetic layer is ferromagnetic or ferrimagnetic.

2. The structure of claim 1, wherein the Heusler compound is tetragonal.

3. The structure of claim 1, wherein the magnetic layer and the magnetic tunnel junction have respective crystalline structures that are coincident with each other.

4. The structure of claim 1, wherein the MnN layer and the magnetic layer have respective crystalline structures that are coincident with each other.

5. The structure of claim 1, wherein the magnetic tunnel junction includes:
the magnetic layer;
a tunnel barrier overlying the magnetic layer; and
a first electrode overlying the tunnel barrier, wherein the first electrode is made of magnetic material.

6. The structure of claim 5, comprising:
a capping layer overlying and in contact with the magnetic tunnel junction.

7. The structure of claim 6, wherein the tunnel barrier is MgO.

8. The structure of claim 6, wherein the tunnel barrier is $Mg_{1-x}Al_{2-x}O_4$, wherein $-0.5<x<0.5$.

9. The structure of claim 6, wherein the tunnel barrier is AlN.

10. The structure of claim 6, comprising:
a second electrode in contact with the MnN layer.

11. An array, comprising:
at least 100 stacked structures given by claim 10, said structures being interconnected to form a memory device.

12. A method, comprising:
writing data into the first electrodes of the array of claim 11.

13. The method of claim 12, comprising:
reading data stored in the first electrodes of the array.

14. A stacked structure, comprising:
a substrate;
a MnN layer overlying the substrate, wherein the MnN layer is predominantly oriented in the (001) direction; and
a magnetic layer overlying and in contact with the MnN layer, wherein the magnetic layer includes a Heusler compound that includes Mn, and wherein the magnetic layer is ferromagnetic or ferrimagnetic.

15. The stacked structure of claim 14, wherein the magnetic layer includes discrete magnetic domains.

16. The stacked structure of claim 15, wherein the discrete magnetic domains have respective magnetization directions that correspond to data that have been stored in the stacked structure.

* * * * *